(12) United States Patent
Feldman et al.

(10) Patent No.: US 7,186,145 B1
(45) Date of Patent: Mar. 6, 2007

(54) ACUTE EXTENDER CARD

(76) Inventors: Michael Feldman, 148 Carl Tennen St., Thornhill ONT (CA) L4J 7B1; Alexander Feldman, 110 Promenade Circle Suite 1512, Thornhill ONT (CA) L4J 7W8; Boris Feldman, 1085 Steels Av. West Apt. 802, Toronto ONT (CA) M2R 2T1

( * ) Notice: Subject to any disclaimer, the term of this patent is extended or adjusted under 35 U.S.C. 154(b) by 0 days.

(21) Appl. No.: 11/284,233

(22) Filed: Nov. 22, 2005

(51) Int. Cl.
*H01R 25/00* (2006.01)
*H01R 12/00* (2006.01)

(52) U.S. Cl. .......... 439/638; 361/738; 439/65
(58) Field of Classification Search .......... 439/638, 439/65, 74; 361/737, 738
See application file for complete search history.

(56) References Cited

U.S. PATENT DOCUMENTS

| | | | |
|---|---|---|---|
| 3,958,858 A * | 5/1976 | Silveira, Jr. | 439/633 |
| 4,473,263 A * | 9/1984 | Sunstein | 439/64 |
| 4,764,414 A * | 8/1988 | Beun | 361/752 |
| 4,862,400 A * | 8/1989 | Selbrede | 439/61 |
| 5,338,207 A * | 8/1994 | Lineberry et al. | 439/62 |
| 5,967,814 A * | 10/1999 | Sikorski, Jr. | 439/165 |
| 6,280,201 B1 * | 8/2001 | Morris | 439/65 |
| 6,567,870 B1 * | 5/2003 | Thomas et al. | 710/62 |
| 2004/0088133 A1 * | 5/2004 | Rabinovich | 702/122 |

* cited by examiner

*Primary Examiner*—Briggitte R. Hammond

(57) ABSTRACT

The acute extender card makes the possibility for testing different electronic components (for example, video cards, sound cards and etc.) without limitation for plug in external cables to the test component at the same time the acute extender minimize the propagation delay for the signals.

5 Claims, 5 Drawing Sheets

ACUTE EXTENDER CARD

FIELD OF THE INVENTION

The present invention relates to extender cards used for testing different types of the electronic devices, and in particular to the geometrical shape of the extender cards.

BACKGROUND OF THE INVENTION

There exist many types of extender cards for testing and debugging various computer components, such as video cards, sound cards, etc. Such components usually have two groups of connectors. One of these groups is used for connection to the main part of the computer, for example, to the motherboard. Another group is used for connection to the different types of the test components (peripheral devices). Most of the peripheral devices, like video cards, sound cards, network cards and etc., have a group of connectors located on the bracket side (front side) of these cards for the external cable connection.

Various extender (extension) cards play a significant role in the computer industry. Such devices make possible debugging (testing) different components inside the working computer unit. They allow access with test equipment (like oscilloscope, logic analyzer and etc.) to the different places of the tested components during real-time operations and give a possibility of hot-swap testing components without shutting-down a computer unit power.

Many similar devices are manufactured by different firms, for example [1, 3]. These extender cards usually consist of the printed circuit board (PCB) and two electrical connector groups. The first group of these connectors is intended for connection to the system motherboard. Such a motherboard is installed in a computer system unit. The second group of these connectors is intended for the plug-in tested component (peripheral device).

These extender cards are of two types: passive or active. The passive extender cards are free from any electronic circuits and connect all matching connectors of both groups by printed wires. The active extender cards have various logical circuits on the cards. The active extender cards make it possible to insert the test component into the extender card socket and to extract said component without shutting-down the power of the computer unit.

Practically, on all known extender cards, (for example, [2]) these two groups of connectors are located on the PCB and are oriented in parallel to one another in the extender card plane.

Usually each group of the apparatus (types and sizes of a computer unit, types and sizes of test components etc.) has corresponding special types of extender cards.

Every extender card produces an additional signal propagation delay, and this additional signal propagation delay disturbs the normal operation of modern computers. It relates to the fast interface signals, such as AGP, PCI-X, PCI express and other fast interfaces. Decreasing the height of the extender card makes the access to the components under test more difficult. In addition, decreasing the height of the extender makes impossible plug-in cables to the front side connector group (bracket side) of the test component. The minimum height of the extender card is dictated by the size of the computer system unit (computer case). In most cases it is significantly large.

In the last few years many new extender cards have been made for various interfaces and computer system units [4, 5]. The majority of these extender cards have small height and even have no possibility for installing the bracket, for example AGPROIX [5], etc. This solution helps to minimize additional signal propagation delay on the extender card, but at the same time the system including this type of extender card and tested component becomes mechanically unstable and there is no possibility to plug-in external cable to the front side connector group (placed on the bracket side) of the test component.

Known patents offer various ways of this problem's alleviation.

In U.S. Pat. Nos. 6,567,870 [6] and 6,356,959 [7] it is offered to use the partial-height PCI cards (for example a half-height or one-third-height card), that can be stacked edge-to-edge and to attach a similar card perpendicular to the main assembled extender card.

This requires having a collection of such cards and may be used if it needs two-three cards only. Otherwise this combination is mechanically unstable. On the other hand, this combination doesn't allow for decreasing the signal propagation delays.

U.S. Pat. No. 5,967,814 [8] protects the unit, allowing to dispose the computer plates in view of the "open book". This way allows providing light access to various points placed on the computer plates, but requires using cables for connection between these plates, which increases the signal propagation delay. The necessity of additional special apparatus prevents the use of this patent by small customers.

In this case, as in U.S. Pat. No. 5,967,796 [9], special jig limits of the application area are used. Moreover, the use of the special cable increases the signal propagation delays.

Patents CA2083017 [10], CA1241396 [11] and CA2386464 [12] display a small mechanical improvements. They promote computer testing, but don't solve the problem of the propagation delay.

Patent CA2328231 [13] offers system that makers only easier plug-in test devices and removing them.

The present invention gives the possibility of full testing [including plug-in cables to the front side connector group (bracket side) of the tested peripheral device] and the convenience of work with the peripheral device without significantly increasing signal propagation delays.

The present invention is equally suitable for use for the different type of computers (computers where the extender card sits in perpendicular to the motherboard or computers where the extender card is parallel to the motherboard).

SUMMARY OF THE INVENTION

The first aspect of the present invention consists in the following:

the present extender card for test components, for example, video cards, network cards and etc., in particular, for components having front side (bracket side) electrical connection group for an external cable, the extender card consisting of the printed circuit board (PCB) and having on this board two electrical connection groups (first and second), first one for connection to the motherboard of the computer system and second one for plug-in test component, these first and second connector groups located on the different edges (bottom and top edges) of the extender card, and an intersection angle between two imaginary straight lines running along said first and second edges correspondently is an acute angle.

The second aspect of this invention consists in the following: the value of the said acute angle is limited by inferior limit and superior limit; the superior limit is determined by predetermined allowable values of the signal propagation delays, and the inferior limit is determined by the shape and the geometrical sizes of the test components and the computer system units that are used.

BRIEF DESCRIPTION OF THE DRAWINGS

These and other features of this invention will be better understood from the following detailed description taken in conjunction with the drawings, wherein.

DETAILED DESCRIPTION OF THE PRESENTLY PREFERRED EMBODIMENT

Figure 1:
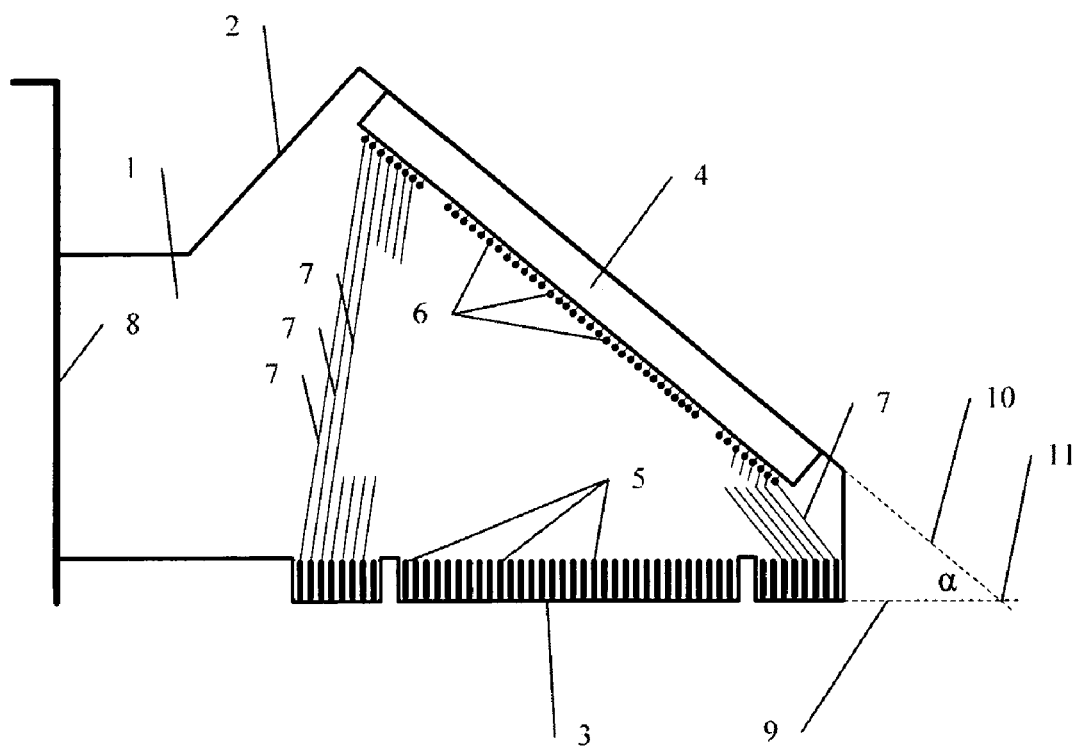
FIG. 1 shows a drawing of the acute extender card in accordance with one embodiment of this invention.

FIG. 1 shows a view of the acute extender card 1 according to the present invention. The base of the acute extender card 1 is printed circuit board (PCB) 2 and two groups of electrical connectors. On the PCB are mounted connector 3 (plug-male) and connector 4 (socket-female) along the two different edges of this printed circuit board (for definiteness, bottom and top edges).

In the passive acute extender card the lamellas 5 of connector 3 are connected to lamellas 6 of connector 4 by printed wires 7 directly (Not all the printed wires 7 are shown on the FIG. 1). In the active acute extender card such connections can pass through the logical circuits.

In FIG. 1 it is shown that bracket 8 is mounted on the printed circuit board 2 for holding the acute extender card 1 inside the computer system unit.

The imaginary straight lines 9 and 10 run along the edges of the printed circuit board 2 under connector 3 and connector 4 accordingly. Said lines coincide with these edges along one or more segments of these edges which said connectors are located. In FIG. 1 the lower edge, on which first connector group is located, consists of three segments.

The straight lines 9 and 10 intersect in the point 11. The intersection angle α, having the vertex in the point 11, is acute.

The printed wires 7 are connecting lamellas (pins) 5 of connector 3 and lamellas 6 (pins) of connector 4. The length of said printed wires defines signal propagation delay value. This length depends of the acute angle value and increases with distance from acute angel vertex 11. If it's necessary to equalize propagation delay across the printed wires 7, then some of the known methods can be used, for example, an additional bends of said printed wires.

Figure 2:
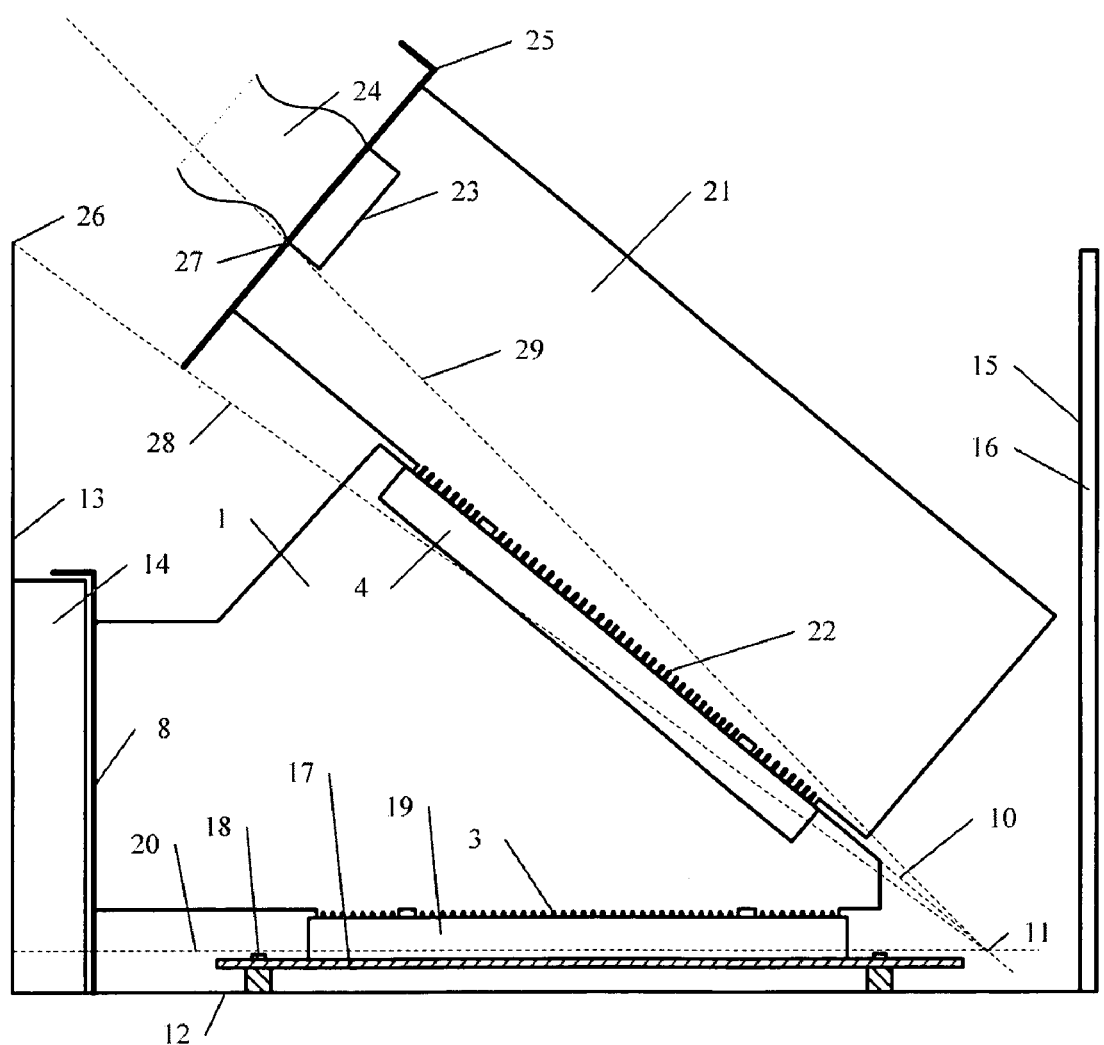
FIG. 2 shows a drawing of the cross-section of the computer system unit in an assembled state together with the acute extender card and the component under test.

In FIG. 2 it is shown the drawing of the computer system unit cross-section by the plane passed through connector 19 placed on the motherboard and intended for the installation of the component.

Note: 1. Case when the motherboard is installed on the bottom side of the computer system unit is taken for simplicity without losing generality.

This cross-section consists of the base (bottom) side 12, sidewall 13 having bulge 14 with the vertical slots (aren't shown) for holding bracket 8 of the acute extender card, and straight line 15 separating varied apparatus 16 (storage unit—HDD, floppy, air fen, etc. including cables). The drawing of this varied apparatus place 16 isn't shown to scale.

Motherboard 17 is fastened on base side 12 by screws 18. On motherboard 17 there is connector 19. The cross-section is passed through connector 19 and is perpendicular to main board (motherboard) 17. Line 20 passes through the bottom of connector 19. When acute extender card 1 is inserted into socket 19, the imaginary straight lines 20 and 9 coincide.

In FIG. 2 it is shown the contour of the assembly, consisting of two devices: the first—acute extender card 1 according to the present invention, and the second—test component (controller) 21. This assembly is inserted into socket 19 placed on motherboard 17. Test component 21 has connector 22 (plug-male placed on the bottom edge), and this connector is inserted into connector 4 located on the top edge of printed circuit board 2 of the acute extender card 1. Test component 21 has connector group 23 located on the bracket-side of the test component board for external cable 24 and bracket 25.

Point 26 is the highest point of sidewall 13. The expression "the highest point" designates the point most removed from the motherboard. Point 27 is the lowest point of connector group 23. This drawing shows the intersection point 11. Imaginary straight line 28 passes through the points 26 and 11. Imaginary straight line 29 passes through points 27 and 11. Line 28 is about the extreme position (the lowermost position defining minimum acute angle α) of imaginary straight line 29. In this case the peripheral cable 24 may be connected to connector group 23 of test component 21 without difficulty and without bends.

Figure 3:
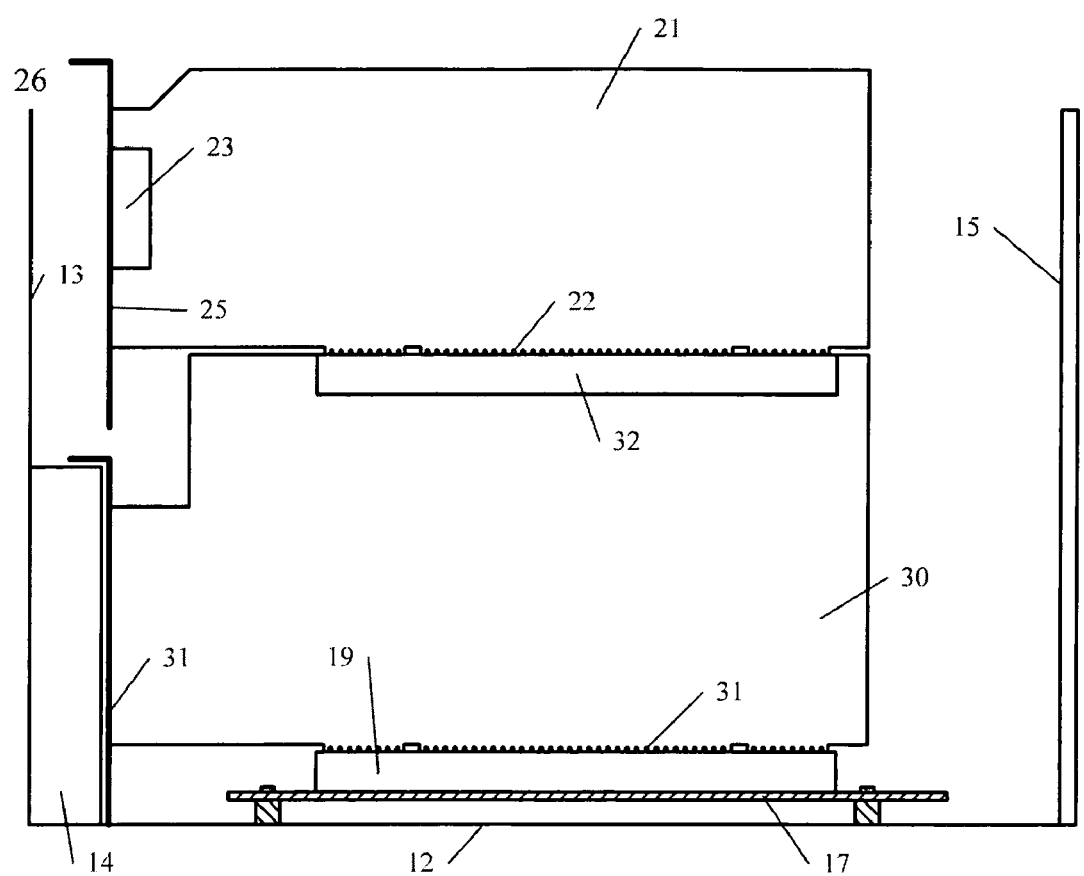
FIG. 3 shows a drawing of a cross-section of the computer system unit in a assembled state together with the most commonly used conventional extender card and component under test (for comparison).

FIG. 3 illustrates the assembly of conventional extender card 30 with bracket 31 and test component 21 with bracket 25. Conventional extender card 30 is inserted into motherboard socket 19. Test component 21 is inserted into socket 33 of said conventional extender card 30. It is shown that there is no possibility to plug-in an external cable to connector group 23 of test component 21.

Figure 4:
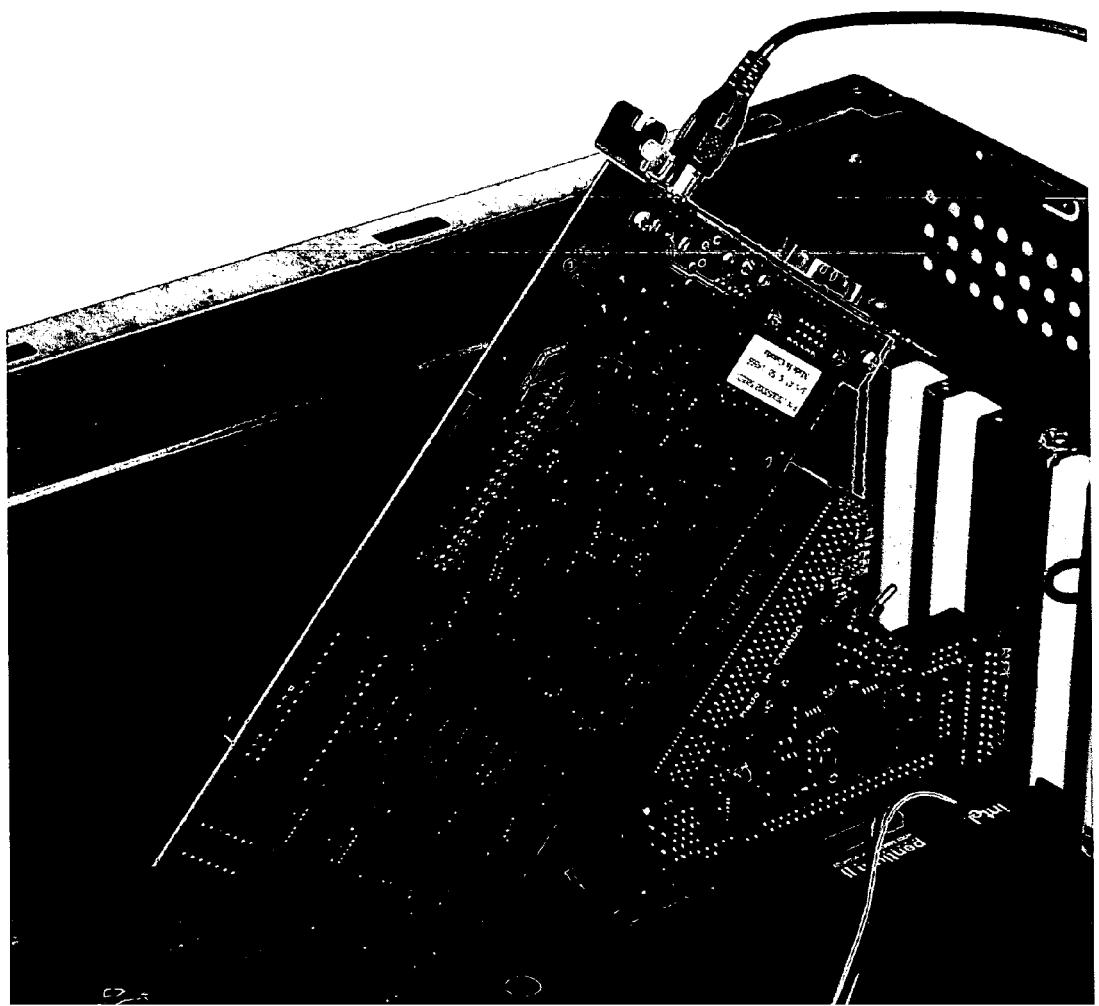
FIG. 4 illustrates the use of the present extender card for the computer system unit, where the acute extender card is placed in perpendicular to the system motherboard (photo).

In FIG. 4 it is shown the view of the present acute extender card in a case where the connector on the top of the acute extender card allows a plug-in test component in the plane of the acute extender card.

Figure 5:
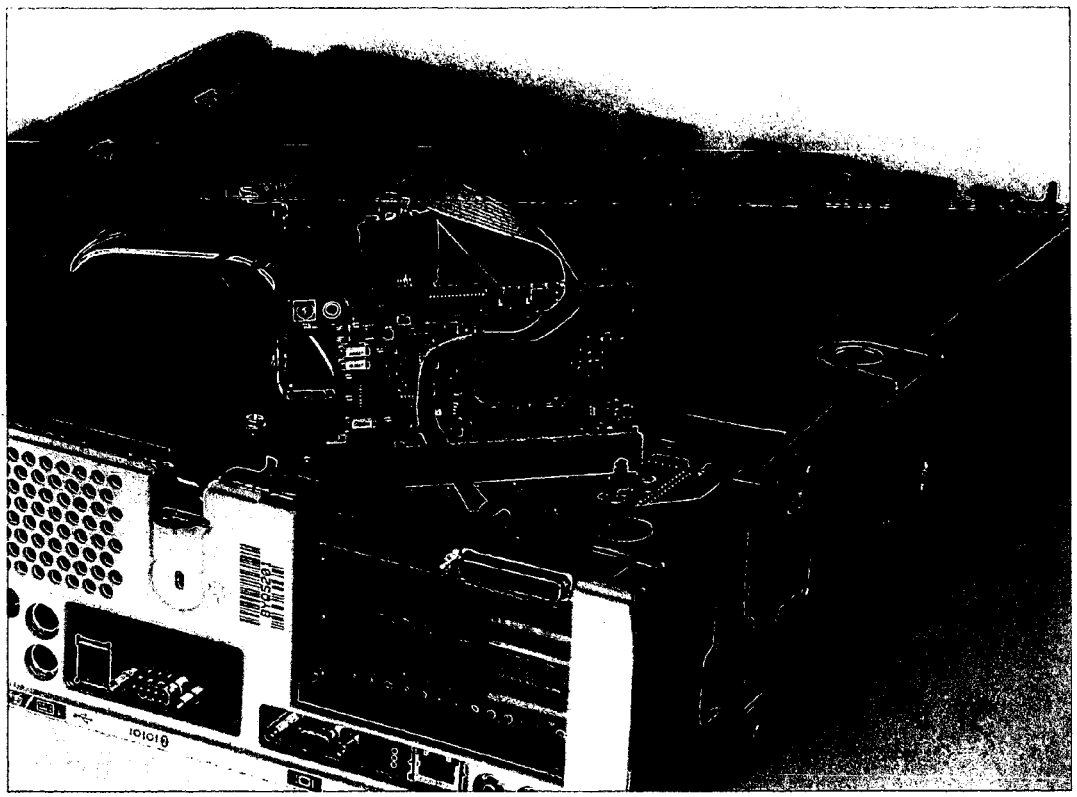
FIG. 5 illustrates the use of the present extender card for the computer system unit, where the acute extender card is placed in parallel to the system motherboard (photo).

In FIG. 5 it is shown a view of the present acute extender card in a case that connector on the top of the acute extender card allows a plug-in test component in perpendicular to the acute extender card.

The dimensions of the computer system unit and the dimension of the test component may vary. This fact dictates the requirement for using term "predetermined collection".

The complete description and the comparison of FIG. 4 and FIG. 5 show the advantage of the present acute extender card over the conventional models.

The acute extender card makes possible the testing of different electronic components without limitation for plug in external cables to the test component; at the same time the acute extender minimizes the propagation delay for the signals.

Practical useful solution is $\alpha=50°$.

We claim:

1. An acute extender card for use in testing a component having electrical connectors for connection to corresponding connectors in a computer system unit, said acute extender card comprising:

a printed circuit board (PCB) having at least two edges: a bottom edge and a top edge, a first electrical connector group for connection to the computer system unit when the PCB is inserted into the computer system unit and a second electrical connector group for connection to the test component when this test component is plugged in said acute extender card;

wherein the first and the second connector groups are placed along the bottom and the top edges of the printed circuit board correspondently, and wherein an intersection angle of two imaginary straight lines running along said bottom and top edges correspondently, is an acute angle.

2. The acute extender card of claim 1, wherein the corresponding connectors of said first and second groups are connected electrically either directly by printed wires or through circuits of signal transformation.

3. The acute extender card of claim 1, wherein the maximum value of said acute angle is such that the signal propagation delay values between matching connectors of said first and the second connector groups are not more than a second predetermined limit.

4. The acute extender card of claim 1, wherein an acute angle value of said acute extender card is more than a first predetermined limit.

5. The acute extender card of claim 4, wherein said first predetermined limit is characterized in that a lower point of the electrical connector group mounted on a bracket-side of said test component when said test component is assembled with the acute extender card in the computer system unit for testing, said lower point is placed farther from said motherboard than the straight line lied in the plane of said acute extender card and passed through two points:

the highest point of the computer system unit sidewall in which is made a bulge for holding brackets and a vertex of said acute angle, for all components and computer system units that are used.

* * * * *